United States Patent

Kunz et al.

Patent Number: 5,944,967
Date of Patent: *Aug. 31, 1999

[54] DUAL TARGET CATHODE ASSEMBLY WITH SHIELDING

[75] Inventors: Hans Kunz, Hasselroth; Andreas Sauer, Aschaffenburg; Manfred Schuhmacher, Alzenau; Joachim Szczyrbowski, Goldbach; Dietmar Marquardt, Erlensee, all of Germany

[73] Assignee: Balzers und Leybold Deutschland Holding AG, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/554,750

[22] Filed: Nov. 7, 1995

[30] Foreign Application Priority Data

Mar. 9, 1995 [DE] Germany .......................... 195 08 405

[51] Int. Cl.⁶ .................................................. C23C 14/34
[52] U.S. Cl. ............................... 204/298.11; 204/298.12; 204/298.19; 204/298.26
[58] Field of Search ........................ 204/192.12, 298.11, 204/298.12, 298.16, 298.17, 298.18, 298.19, 298.26

[56] References Cited

U.S. PATENT DOCUMENTS 4,169,031 9/1979 Brors ................................ 204/298.19

FOREIGN PATENT DOCUMENTS 2573441 5/1986 France .............................. 204/298.12

Primary Examiner—Nam Nguyen
Assistant Examiner—Rodney G. McDonald
Attorney, Agent, or Firm—Fulbright & Jaworski, LLP.

[57] ABSTRACT

A dual magnetron cathode assembly includes a pair of elongate, parallel targets in coplanar relationship fixed to respective magnetic yokes with associated rows of permanent magnets for producing a magnetic field over the targets. A common back plate is provided for both cathodes, a center shield plate extending from the back plate to between the targets, side shield plates and end shield plates likewise extending from the back plate to form side-by-side rectangular shielding enclosures which expose only the sputtering surface of the targets. The yokes are fixed with respect to the vacuum chamber by insulative holders which extend through openings in the back plate.

3 Claims, 5 Drawing Sheets

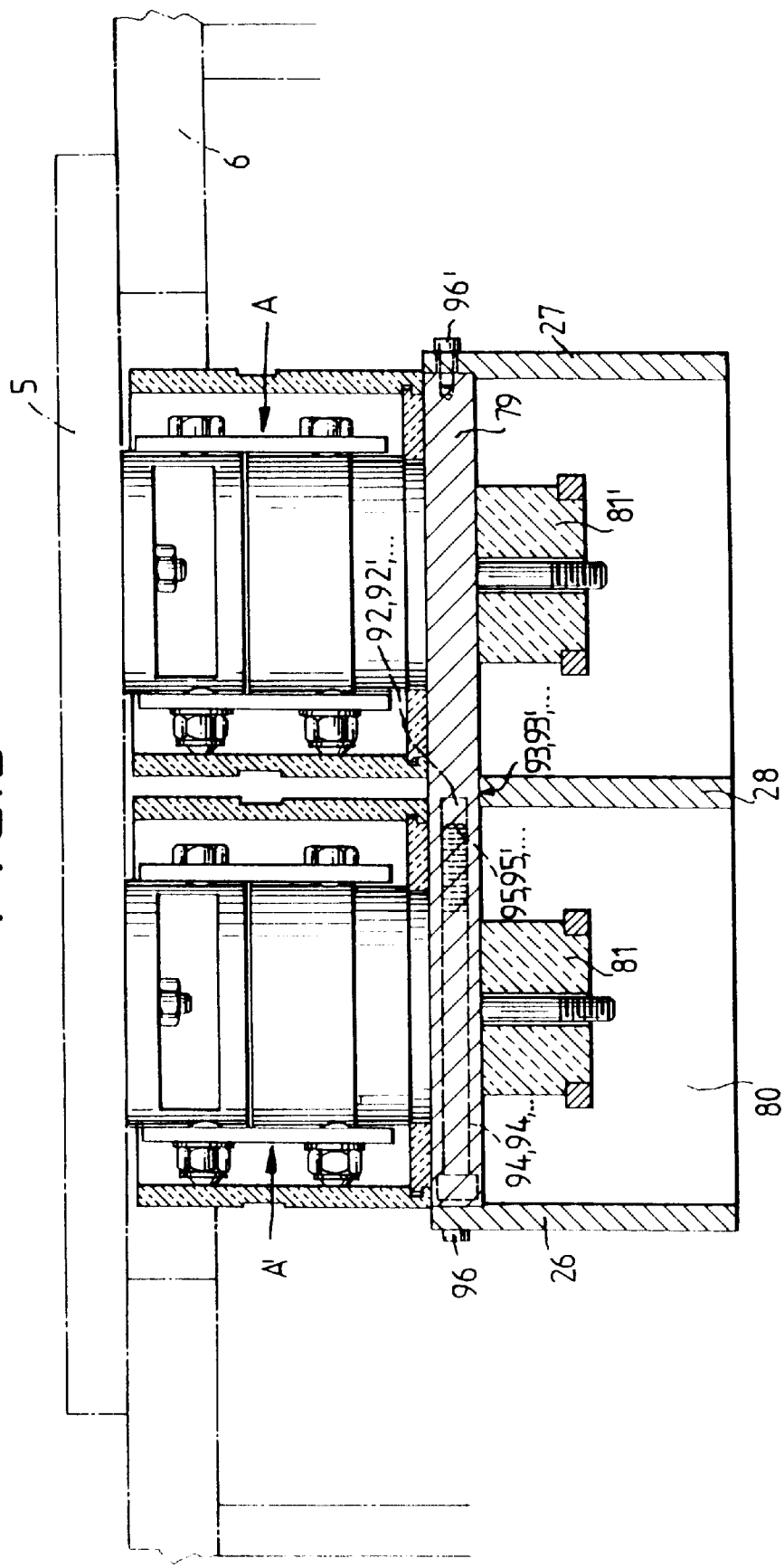

DUAL TARGET CATHODE ASSEMBLY WITH SHIELDING

BACKGROUND OF THE INVENTION

The invention pertains to a cathode design for a device for sputtering a target pair, the device comprising magnetic yokes; targets with narrow, elongated, plate-shaped configurations; permanent magnets installed between the targets and the magnetic yokes; and holders for attaching the magnetic yokes to a section of the wall of the vacuum chamber.

SUMMARY OF THE INVENTION

The present invention is based on the task of creating a twin cathode for sputtering highly insulating materials, that is, a cathode which makes it possible to achieve a high sputtering rate and a stable process. In particular, the goal of the invention is to optimize the cooling of the targets, the replacement of the targets, and the magnetic field configuration. Finally, the targets are to be designed in such a way that they can be replaced very quickly and easily.

This goal is accomplished by a common cover or base plate covering both cathodes, this plate being provided with several side plates, which extend along and parallel to the base plate and which can be connected to it, and also with a center plate and end plates, where the base plate is connected rigidly by way of electrically insulating holders to a section of the wall of the vacuum chamber. The base plate cooperates with the side and end plates to form a container, open on one side, which encloses the cathodes. Only the surfaces of the two targets to be sputtered, i.e., the surfaces on the side of the cathodes facing away from the base plate, are freely accessible from the vacuum chamber.

BRIEF DESCRIPTION OF THE DRAWING

FIG. 5 shows a transverse section through the cathode design according to FIG. 1, but with the cathodes removed from the central plate.

DETAILED DESCRIPTION OF THE PREFERRED EMBODIMENT

Figure 1:
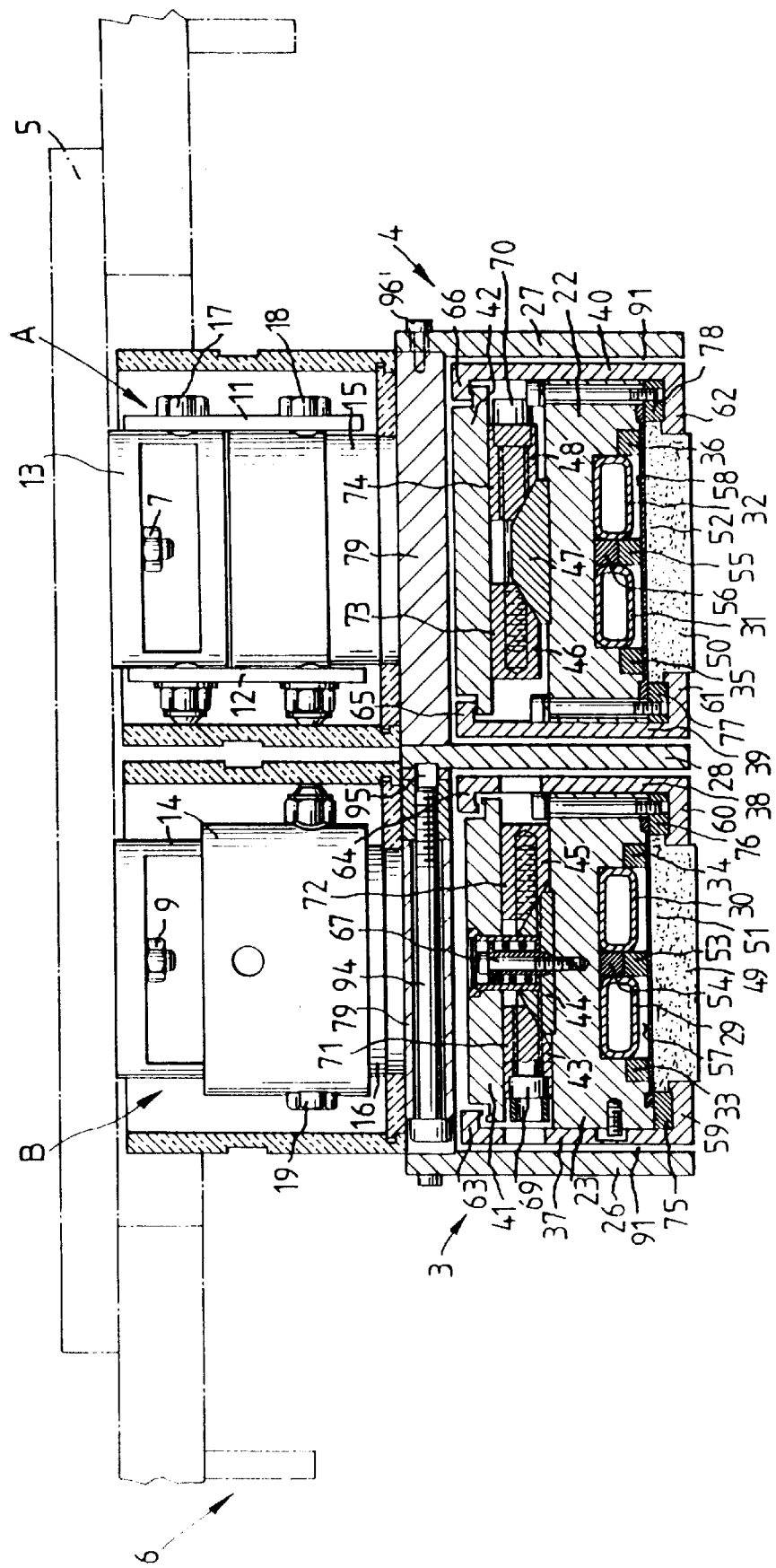
FIG. 1 shows a transverse section through a twin-cathode design according to the invention.
Figure 2:
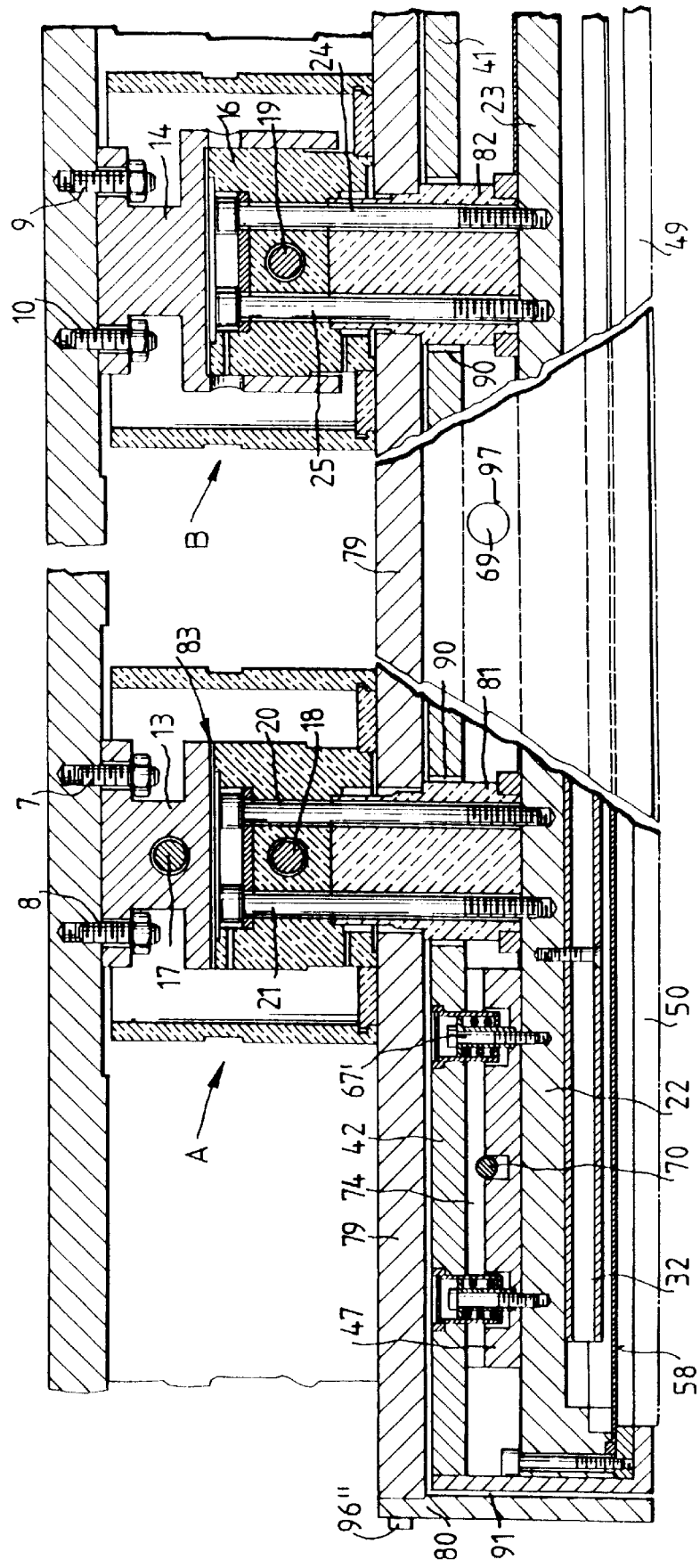
FIG. 2 shows a lengthwise section through the cathode design according to FIG. 1.
Figure 3:
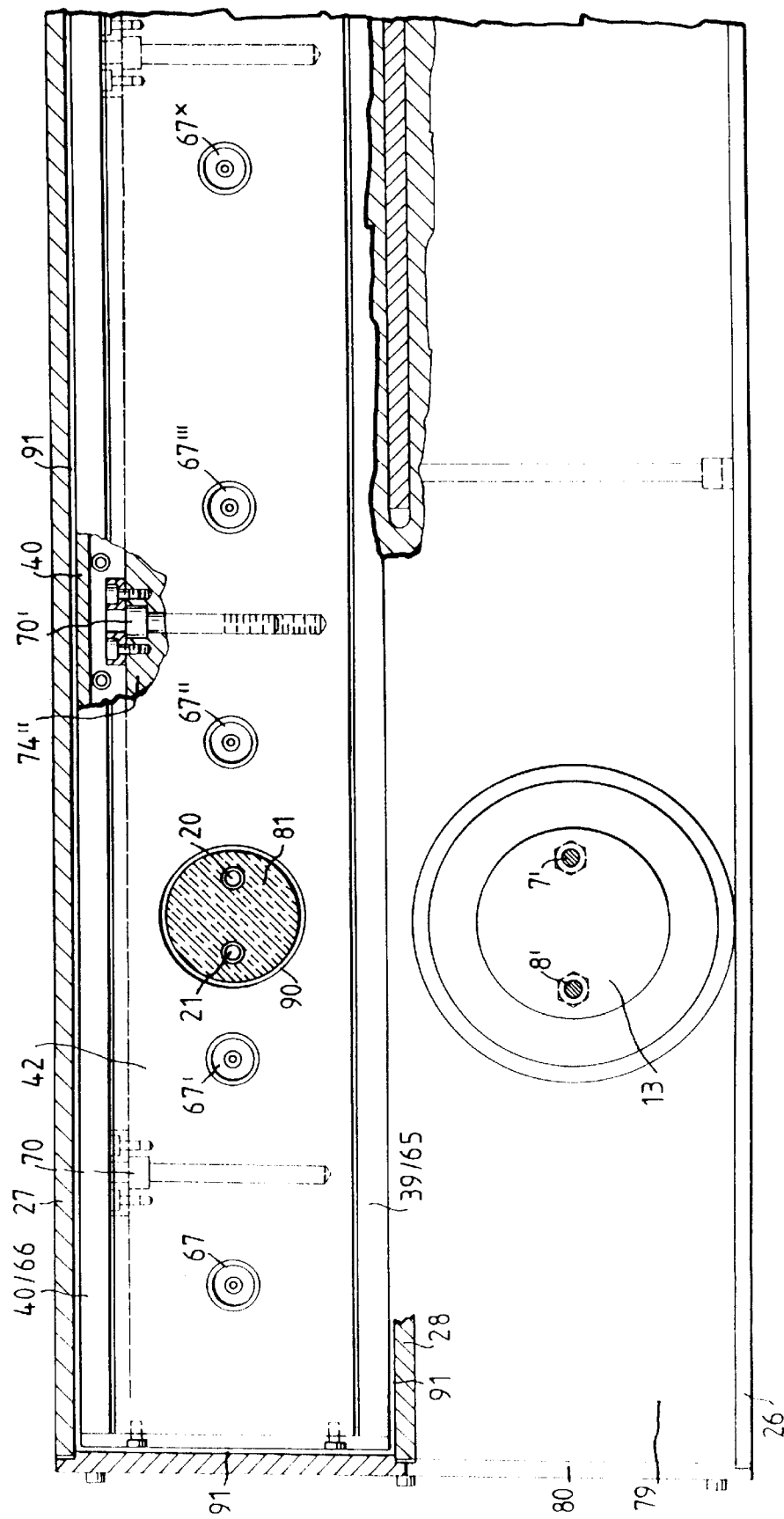
FIG. 3 shows a top view of the twin-cathode design according to FIGS. 1 and 2 in partial cross section.
Figure 4:
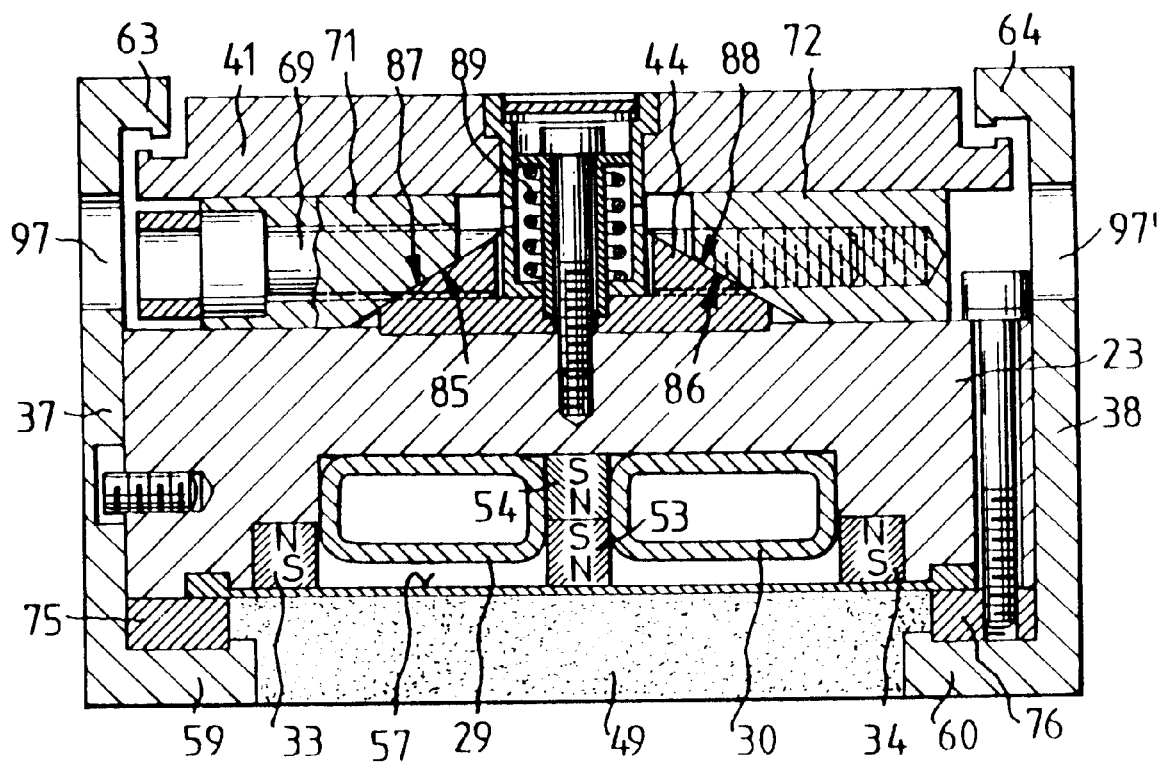
FIG. 4 shows a transverse section through a cathode on an enlarged scale.

As FIGS. 1 and 2 show, the two cathodes 3, 4 are attached to an upper wall section 5 of a vacuum chamber 6 by means of screws 7, 8; 9, 10. Cathodes 3, 4 themselves can be either connected to pillow blocks 13 and insulators 15 indirectly by way of brackets 11, 12, which thus form links of a chain, and screws 17, 18, or connected to pillow blocks 14 directly by screws 19 and insulators 16. Insulators 15, 16 for their part are screwed to magnetic yokes 22, 23 by stud bolts 20, 21; 24, 25, so that cathodes 3, 4, together with their enclosing side plates 26, 27, 28; magnetic yokes 22, 23; cooling tubes 29–32; permanent magnets 33–36; 53–56; clamping bars 37–40; top plates 41, 42; wedge jaws 71–74; wedge blocks 44, 47; and targets 49, 50, by way of their rear plates 51, 52, are able to hang from the upper section 5 of the wall.

Targets 49, 50, i.e., their base portions 51, 52, are pressed by clamping bars 37–40 against membranes 57, 58, because ends 59–62 of the bars facing the substrate are provided with claws which engage base portions 51, 52 and pull them tightly against magnetic yokes 22, 23, for which purpose claws 63–66 at the ends of the bars facing away from the rear plates are also designed to engage top plates 41, 42, each of which is otherwise connected by screws 67, 68 to the magnetic yokes.

To connect targets 49, 50 rigidly to magnetic yokes 22, 23, clamping screws 69, 70, which connect wedge jaws 71, 72; 73, 74 together, are screwed in against blocks 44, 47 until rear plates 41, 42 rest firmly against upper claws 63–66 at the top and lower claws 59–62 rest firmly against spacer bars 75–78 at the bottom, so that all of the parts gripped by clamping bars 37–40 are connected rigidly together. Because pillow blocks 13, 14 are rigidly connected to magnetic yokes 22, 23 by means of screws 20, 21; 24, 25, the yokes are supported by upper wall section 5 of vacuum chamber 6. At the same time, cover plate 79 is supported on insulators 81, 82, which are held in place in turn by screws 20, 21; 24, 25. Because a gap 83 is provided between pillow block 13 and insulator 15, cathodes 3, 4 can execute a certain motion in the horizontal plane relative to the means of suspension shown on the right in FIG. 2 (because insulators 15, 16 are connected to pillow blocks 13, 14 in an articulated manner by way of brackets 11, 12 and screws 17, 18 and therefore act like links in a chain). Cathodes 3, 4 are very long; each of the two long cathodes 3, 4 is attached to upper wall section 5 by several suspension points of type A (shown on the left in FIG. 2), distributed over the length of the cathodes, and by one suspension point of type B (shown on the right in FIG. 2)

The dark space shielding includes base plate 79, which extends over both rear surfaces of the cathodes; center plate 28, which forms the side wall shielding for both cathodes 3, 4 simultaneously, and plates 26, 27, 80 provided at the outer sides and ends of cathodes 3, 4. All shield plates 26, 27, 28, 80, which are perpendicular to base plate 79, terminate at the same level as the front end or claw of clamping bars 37–40. The one-part or multi-part center plate 28 is held permanently in position by screws 94, and is locked positively in place. Screws 94 are received through base plate 79 in such a way that they are protected from acquiring a coating.

Side shield plates 26, 27 can be removed by unscrewing fastening screws 96. Gap 90, 91 extending around cathodes 3, 4 is designed with a value of 3 mm for a sputtering pressure of approximately $3 \times 10^{-3}$ mbars.

Because of the compact construction of the two cathodes 3, 4, there is only one process zone on the substrate.

Flashovers between cathodes 3, 4 are prevented by the electrically "floating" suspension of the frame-like dark space shielding 26, 27, 28, 79, 80. The shielding is attached in a centered manner with respect to the cathode body; this manner of attachment prevents contact between the shielding and the cathodes. Side shield plates 26, 27, 28, and end plates 80 can be provided with holes 97, which provide access to the wedge screws 69, 70 and make it possible to replace the targets without loosening the shielding along the long sides.

The cathode design described above results in especially good firing of cathodes 3, 4.

What is claimed is:

1. Cathode assembly comprising
   a pair of elongate plate targets arranged in parallel, coplanar relationship to each other, each target having a surface to be sputtered,
   a common base plate to which said targets are attached, said targets being parallel to said base plate, a center shield plate fixed perpendicularly to said base plate and extending between said targets, a pair of side shield plates fixed perpendicularly to said base plate and extending in parallel along said targets opposite from said center shielding plate, and a pair of end shield plates fixed perpendicularly to said base plate and perpendicularly to said side shield plates to form enclosures which expose said surfaces to be sputtered, said base plate being provided with recess means and said center shield plate being provided with lobe means received in said recess means, said lobe means being provided with tapped bore means, said base plate being provided with bore means perpendicular to said center shield plate, said assembly further comprising screw means received through said bore means in said base plate and threaded into said tapped bore means in order to fix said center shield plate to said base plate.

2. Cathode assembly as in claim 1 wherein said base plate has lateral edges provided with tapped bores, said side shield plates being fixed to said lateral edges by screw means.

3. Cathode assembly as in claim 1 further comprising a magnetic yoke between each target and said base plate, opening means through said base plate, and electrically insulating holding means extending through said opening means and fixed to said yoke means.

\* \* \* \* \*